(12) United States Patent
Koudelka

(10) Patent No.: US 6,859,509 B1
(45) Date of Patent: Feb. 22, 2005

(54) WIDE BANDWIDTH PHASE-LOCKED LOOP CIRCUIT

(75) Inventor: Robert David Koudelka, New Haven, CT (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/500,607

(22) Filed: Feb. 4, 2000

(51) Int. Cl.[7] .................................................. H03D 3/24
(52) U.S. Cl. ..................... 375/373; 375/375; 375/376
(58) Field of Search ........................... 375/371–373, 375/374, 375, 376, 377, 359, 360; 327/141–162, 131–134; 708/852

(56) References Cited

U.S. PATENT DOCUMENTS

| | | | |
|---|---|---|---|
| 3,983,498 A | 9/1976 | Malek ........................ 328/155 |
| 4,180,783 A | 12/1979 | Khalifa .......................... 331/2 |
| 4,229,827 A * | 10/1980 | Bowman ..................... 455/87 |
| 4,302,845 A * | 11/1981 | McClaughry et al. ....... 375/328 |
| 4,500,851 A | 2/1985 | Sawa et al. ..................... 331/2 |
| 4,513,256 A * | 4/1985 | Kurihara et al. ............... 331/4 |
| 4,590,602 A | 5/1986 | Wolaver ..................... 375/120 |
| 4,660,182 A * | 4/1987 | Bates et al. ..................... 367/3 |
| 5,015,970 A | 5/1991 | Williams et al. .............. 331/11 |
| 5,119,043 A * | 6/1992 | Borwn et al. ................. 331/16 |
| 5,304,955 A * | 4/1994 | Atriss et al. ................ 331/1 R |
| 5,727,038 A | 3/1998 | May et al. ................... 375/376 |
| 5,764,712 A | 6/1998 | Branstad et al. ............ 375/376 |
| 5,805,649 A | 9/1998 | Travaglia et al. ........... 375/376 |
| 5,812,619 A | 9/1998 | Runaldue .................... 375/376 |
| 5,909,149 A * | 6/1999 | Bath et al. ...................... 331/2 |
| 5,963,068 A * | 10/1999 | Hardesty et al. ............ 327/156 |
| 5,963,608 A * | 10/1999 | Casper et al. ............... 375/373 |
| 6,091,304 A * | 7/2000 | Harrer ......................... 331/10 |
| 6,175,259 B1 * | 1/2001 | Mann et al. ................ 327/159 |
| 6,215,834 B1 * | 4/2001 | McCollough ............... 375/375 |

* cited by examiner

Primary Examiner—Tesfaldet Bocure
(74) Attorney, Agent, or Firm—Theodore U. Ro

(57) ABSTRACT

A PLL circuit uses a multiple frequency range PLL in order to phase lock input signals having a wide range of frequencies. The PLL includes a VCO capable of operating in multiple different frequency ranges and a divider bank independently configurable to divide the output of the VCO. A frequency detector detects a frequency of the input signal and a frequency selector selects an appropriate frequency range for the PLL. The frequency selector automatically switches the PLL to a different frequency range as needed in response to a change in the input signal frequency. Frequency range hysteresis is implemented to avoid operating the PLL near a frequency range boundary.

23 Claims, 9 Drawing Sheets

WIDE BANDWIDTH PHASE-LOCKED LOOP CIRCUIT

WIDE BANDWIDTH PHASE-LOCKED LOOP CIRCUIT

This invention relates to a phase-locked loop circuit having a wide bandwidth and a method of implementing the same.

ORIGIN OF THE INVENTION

The invention described herein was made by employee(s) of the United States Government and may be made and used by or for the Government of the United States of America for governmental purposes without the payment of any royalties thereon or therefor.

BACKGROUND OF THE INVENTION

The quality of a clock signal tends to degrade as the signal travels down a transmission line due to attenuation, interference, noise, and a number of other factors. One method of compensating for this problem at the receiving end is by using a phase-locked loop ("PLL") to synthesize a signal having the same frequency and wave form as the original clock signal. FIG. 1 illustrates a functional block diagram of a basic PLL. A phase comparator 10 produces a DC or low frequency signal having a voltage proportional to the phase difference between an input signal and an output signal (which also acts as the reference signal for the phase comparator 10). The DC or low frequency signal from the phase comparator 10 is filtered by a low frequency loop filter 12 and applied to the input of a voltage-controlled oscillator ("VCO") 14. The VCO increases or decreases the frequency of the output signal based on the voltage of the signal from the phase comparator 10. The output signal is then fed back to the phase comparator 10 for phase comparison with the input signal. If the frequencies of the two signals are different, resulting in a phase difference, the phase comparator 10 adjusts the control signal voltage until the VCO 14 has increased or decreased the output signal frequency sufficiently to eliminate the phase difference. In this way, the output signal can be phase-locked with the input signal.

PLLs generally have narrow bandwidths and, therefore, are limited in the range of frequencies the PLLs can phase lock. A PLL designed for low frequency will not generally phase lock a high frequency signal, and vice versa. This makes the basic PLL unsuitable for use in applications where broad bandwidths are required.

One attempt to address this shortcoming is to provide the PLL with multiple frequency ranges such as in Cypress Semiconductor's programmable skew clock buffer ("PSCB"). This integrated circuit timing generator includes, among other functions, an internal PLL with three user-selectable VCO frequency ranges: 15–30, 25–50, and 40–80 MHz. A user may configure the PSCB VCO to oscillate in any one of the three ranges by setting the appropriate input pins. Furthermore, the output of the PSCB VCO may be divided by up to a factor of four by appropriate selection of internal dividers. Division of the VCO output allows the PSCB PLL to phase lock signals having frequencies as low as 3.75 MHz (15 MHz÷4=3.75 MHz) even though such frequencies are technically outside the lowest PSCB VCO frequency range. Data sheets and application notes for the PSCB may be obtained from Cypress Semiconductor's home page, http://www.cypress.com, and are incorporated herein by reference.

Although the multiple frequency ranges of the PSCB PLL allow it to phase lock either high or low frequencies, the bandwidth of each frequency range is still relatively narrow. In other words, once the PSCB is configured to operate in a particular frequency range, it is effectively dedicated to that frequency range and will be unsuitable for use in applications requiring different frequency ranges or broader bandwidths.

SUMMARY OF THE INVENTION

The PLL circuit of the present invention uses a PLL having multiple frequency ranges to phase lock an input signal having a wide range of frequencies. The circuit selects one of the multiple frequency ranges based on the frequency of an input signal and configures the PLL to operate in the selected frequency range. A new frequency range may be subsequently selected as necessary to track changes in the input signal frequency.

In general, in one aspect, the invention relates to a wide bandwidth phase-lock loop circuit. The circuit comprises a frequency detector, a frequency range selector connected to the frequency detector, and a PLL connected to the frequency range selector. The PLL can be configured to operate in a number of frequency ranges, and the frequency range selector configures the PLL to operate in one of these frequency ranges based on information about the input signal frequency obtained by the frequency detector.

In general, in another aspect, the invention relates to a method of phase locking a signal having a wide range of frequencies. The method comprises obtaining information on an input signal frequency, selecting one of a plurality of frequency ranges based on the input signal frequency information, and generating an output signal having a frequency within the selected frequency range.

In general, in another aspect, the invention relates to a phase-lock loop circuit having a wide bandwidth. The circuit comprises means for obtaining information on an input signal frequency, and means for selecting one out of a plurality of frequency ranges based on the input signal frequency information. The circuit also comprises means for generating an output signal having a frequency within the selected frequency range.

Advantages of the invention include a PLL circuit that can phase lock signals having a wide range of frequencies. Other advantages of the invention will become apparent from the following description and the claims.

DETAILED DESCRIPTION OF THE PREFERRED EMBODIMENTS

Figure 1:
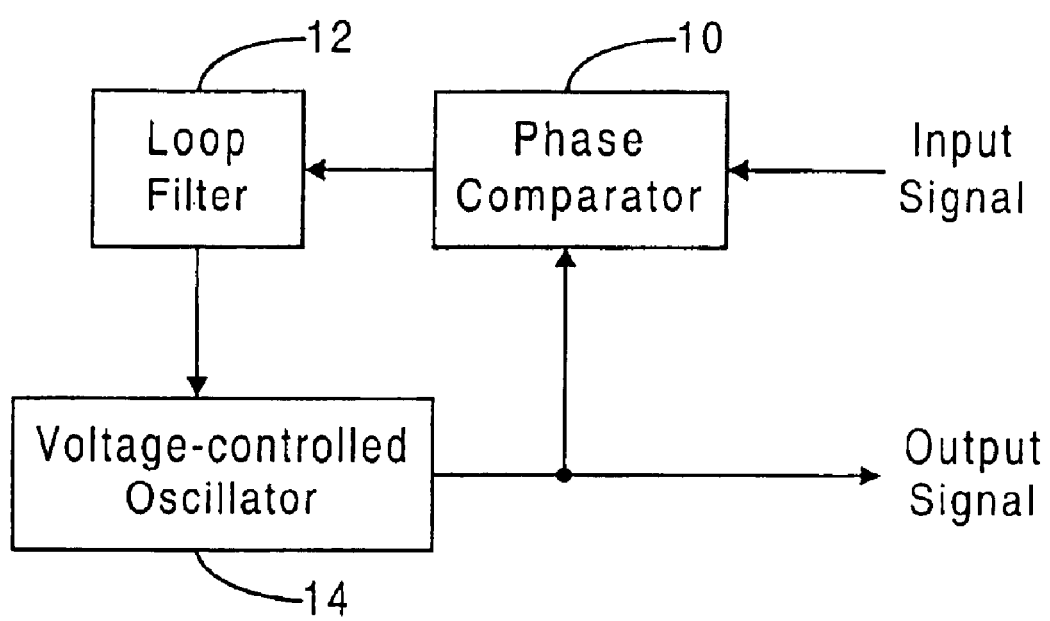
FIG. 1 is a block diagram of a basic PLL.
Figure 2:
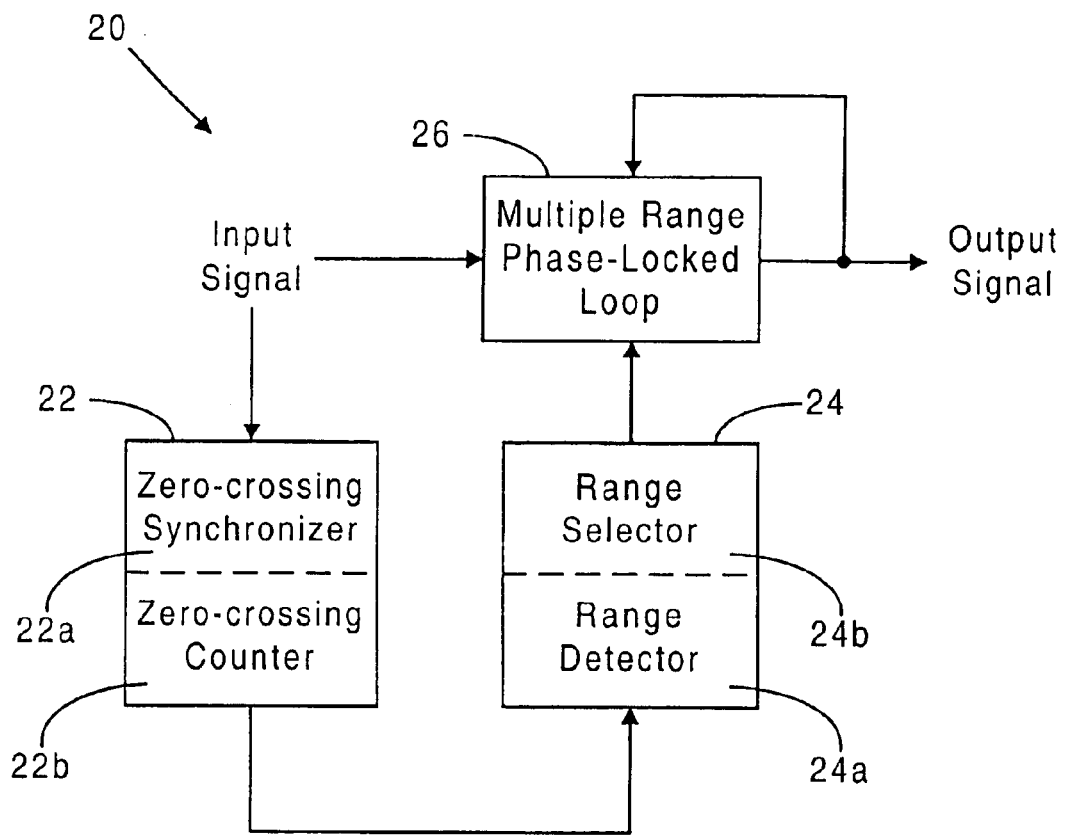
FIG. 2 is a block diagram of the invention.

Referring to FIG. 2, a PLL circuit 20 has a frequency detector 22, a frequency range selector 24 connected to the frequency detector 22, and a multiple frequency range PLL 26 connected to the frequency range selector 24. The frequency detector 22 obtains the frequency of an input signal and provides this information to the frequency range selector 24. The frequency range selector 24 determines which one of a plurality of frequency ranges the input signal frequency falls within and selects an appropriate frequency range for the multiple frequency range PLL 26. The multiple frequency range PLL 26 generates an output signal having a frequency within the selected frequency range and corresponding to the input signal frequency. If the input signal frequency changes such that a different PLL frequency range is required, the frequency range selector 24 selects a new frequency range and configures the PLL 26 accordingly.

For purposes of this description, the input signal can have, but is not limited to, any frequency ranging approximately from 2–48 MHz. The frequency detector 22, frequency range selector 24, and multiple frequency range PLL 26 will now be discussed in detail.

Frequency Detector

The frequency detector 22 obtains the frequency of the input signal, or more accurately, obtains the number of cycles (which is the inverse of frequency) in the input signal by counting the number of "zero-crossings" in the input signal over a predetermined time interval. Zero-crossing refers to the transition of a signal from a logic HIGH to a logic LOW state, and vice versa. Two consecutive zero-crossings constitute one cycle.

In one embodiment, the frequency detector 22 includes two functional components, a zero-crossing synchronizer 22a and a zero-crossing counter 22b. The function of the zero-crossing synchronizer 22a is to synchronize the input signal to a global clock signal so that the zero-crossing counter 22b can accurately count the number of cycles in the input signal. The global clock signal may be provided, for example, by a 50 MHz crystal oscillator (not shown) on-board the PLL circuit 20. Both the zero-crossing synchronizer 22a and zero-crossing counter 22b may be implemented using a single Altera EPM7064LC44-7 programmable logic device ("PLD"). Data sheets for the Altera PLD are available from the company's home page, http://www.altera.com, and are incorporated herein by reference.

Figure 3:
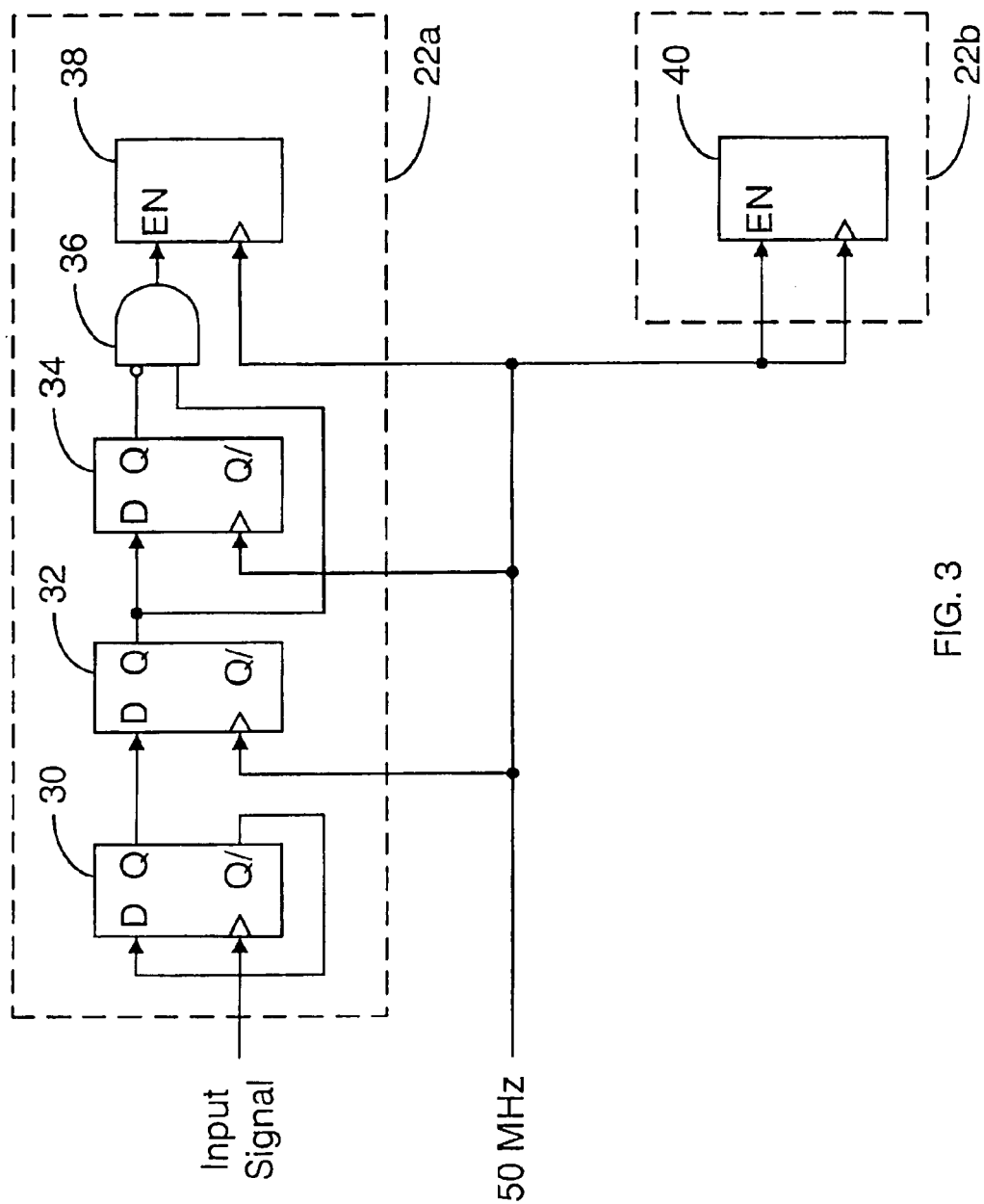
FIG. 3 is a schematic diagram of a zero-crossing synchronizer.

The zero-crossing synchronizer 22a may be implemented by programming three D-type flip-flops 30, 32, 34, an AND-gate 36, and a cycle counter 38 into the PLD, all of which are graphically depicted in FIG. 3. The flip-flop 30 receives the input signal and is configured to divide the frequency of the input signal by two. As should be well known to those having ordinary skill in the art, a 2–48 MHz input signal needs to be synchronized with a clock signal having at least twice the maximum frequency of the input signal, or 96 MHz to prevent aliasing of the input signal. Because the Altera PLD has a maximum operating frequency of only 83.3 MHz, it is necessary to reduce the maximum frequency of the input signal. Therefore, the flip-flop 30 has been configured to reduce the maximum input signal frequency by half (to 24 MHz), and the 50 MHz clock signal is used as the synchronizing clock signal. The flip-flop 32 receives the output of the flip-flop 30 and synchronizes the output of the flip-flop 30 to the 50 MHz clock signal which also clocks the flip-flop 32. Because the flip-flop 32 is clocked at more than twice the maximum output frequency of the flip-flop 30, aliasing should not occur, and all outputs from the flip-flop 30 should be latched correctly by the flip-flop 32.

The output of the flip-flop 32 is applied to the input of the flip-flop 34 and also to one input of the AND-gate 36. The output of the flip-flop 34 is then applied to the other, inverted input of the AND-gate 36. This arrangement prevents any one cycle of the output of the flip-flop 30 from being counted more than once because the AND-gate 36 turns on only when both the output of the flip-flop 32 is HIGH and the output of the flip-flop 34 is LOW. However, if a HIGH appears at the input of the flip-flop 32 for two or more consecutive clock cycles, the output of the flip-flop 34 will go HIGH, thus turning off the AND-gate 36 and stopping the count.

The cycle counter 38 is also clocked by the 50 MHz clock signal and is incremented only when the AND-gate 36 is turned on. Again, this ensures each cycle of the output of the flip-flop 30 is counted only once.

The zero-crossing counter 22b is implemented by programming the PLD to include a main counter 40 which is clocked by the 50 MHz clock signal. The main counter 40 is used to time the interval during which the cycle counter 38 counts the cycles of the input signal.

Figure 4:
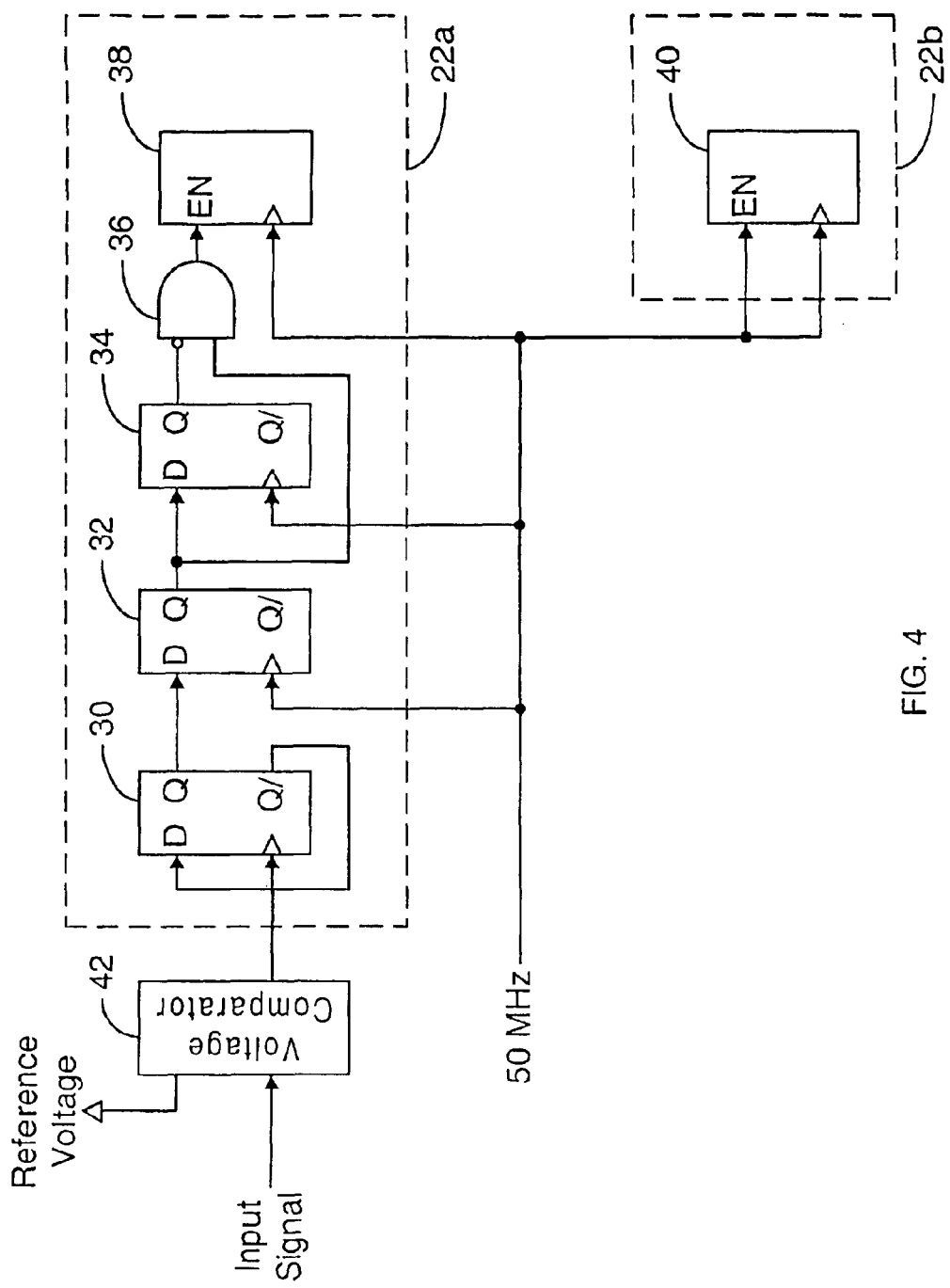
FIG. 4 is a schematic diagram of a zero-crossing synchronizer including a voltage comparator.

In one embodiment, referring to FIG. 4, the input signal may be applied to the input of a voltage comparator 42 instead of directly to the input of the flip-flop 30 to condition and shape the wave form of the input signal. The comparator 42 outputs a LOW when the voltage of the input signal drops below a reference voltage of the comparator 42 and a HIGH otherwise. The output of the comparator 42 is then applied to the input of the flip-flop 30, thus providing clear, well-shaped square waves to the flip-flop 30. The reference voltage of the comparator 42 is preferably set at halfway between the minimum and maximum voltage of the input signal to optimize the accuracy of the comparator 42. If necessary, a voltage divider (not shown) may be used to reduce large swings in the input signal voltage.

Figure 5:
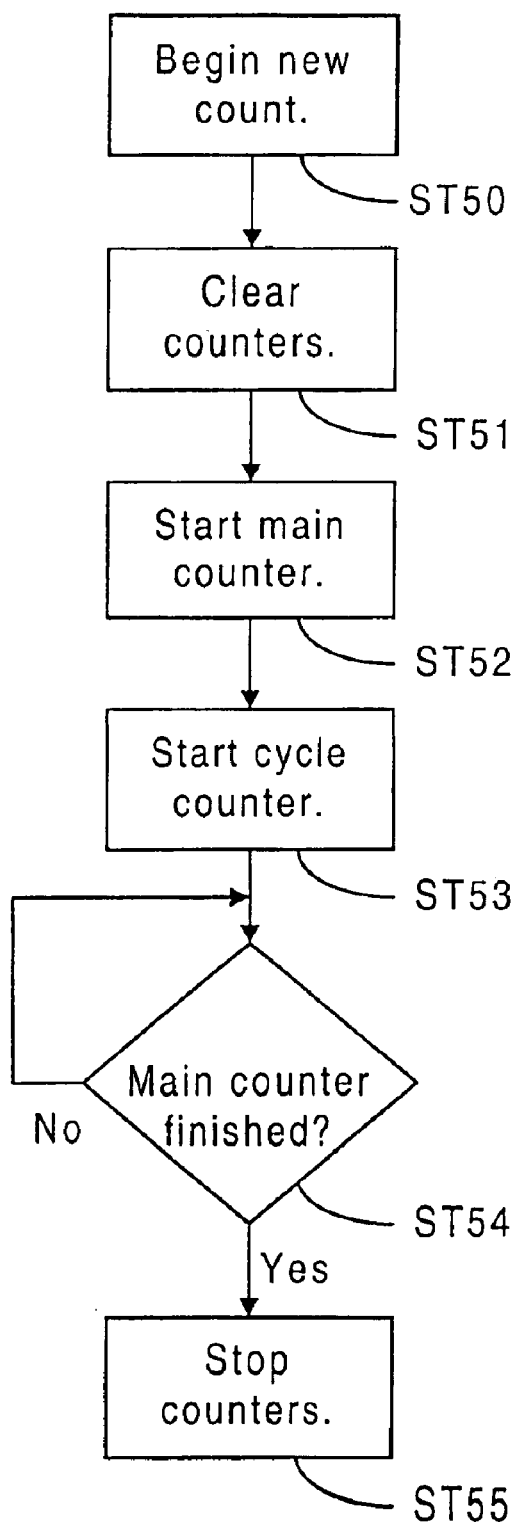
FIG. 5 is a flow diagram for a zero-crossing counter.

Operation of the frequency detector 22 is shown in FIG. 5 (with reference to FIG. 3). Upon receiving a pre-selected signal from the frequency range selector 24 (ST50) via one of the PLD input pins, indicating that the frequency range selector 24 is ready for a new count, the frequency detector 22 clears both the cycle counter 38 and the main counter 40 (ST51). The frequency detector 22 then starts both counters 38, 40 (ST52, ST53) and, in some embodiments, sends a signal to the frequency range selector 24 via one of the PLD output pins to indicate a count is in progress. In some embodiments, the main counter 40 counts from 0 to 2047 by one, which takes 40.94 μs to complete using the 50 MHz clock. During this time, the cycle counter 38 counts the cycles of the input signal which are propagating through the flip-flops 30, 32, 34. When the main counter 40 reaches 2047 (ST54), the frequency detector 22 stops both counters 38, 40 (ST55) and, in some embodiments, sends a signal to the frequency detector 24 to indicate the count is finished. The frequency detector 22 may then provide the number of cycles counted, or the "count," to the frequency detector 24 for frequency range determination, as will be described further herein.

Frequency Range Selector

Referring again to FIG. 3, after receiving the count from the frequency detector 22, the frequency range selector 24 determines an appropriate frequency range based on the count and configures the multiple frequency range PLL 26 to operate in that frequency range accordingly. In some embodiments, the frequency range selector 24 includes two functional components, a range detector 24a which determines an appropriate frequency range for the count received, and a range selector 24b which confirms the frequency range and configures the multiple frequency range PLL 26 to operate in that frequency range. Both functional components may be implemented also using an Altera PLD.

In one embodiment, the PLD for the frequency range selector 24 uses a 12.5 MHz instead of the 50 MHz clock signal. The reason for this is, generally, the larger the amount of logic implemented by the PLD, the slower the PLD must be clocked. Therefore, because the frequency range selector 24 requires more logic to implement relative to the frequency detector 22, the PLD for the frequency range selector 24 must be clocked at a slower frequency. The 12.5 MHz clock signal may be a separate clock signal or it may be the same 50 MHz clock signal divided by four. Division by four of the 50 MHz clock signal may be implemented, for example, by configuring two T-type flip-flops (not shown) to divide by two each.

Figure 6:
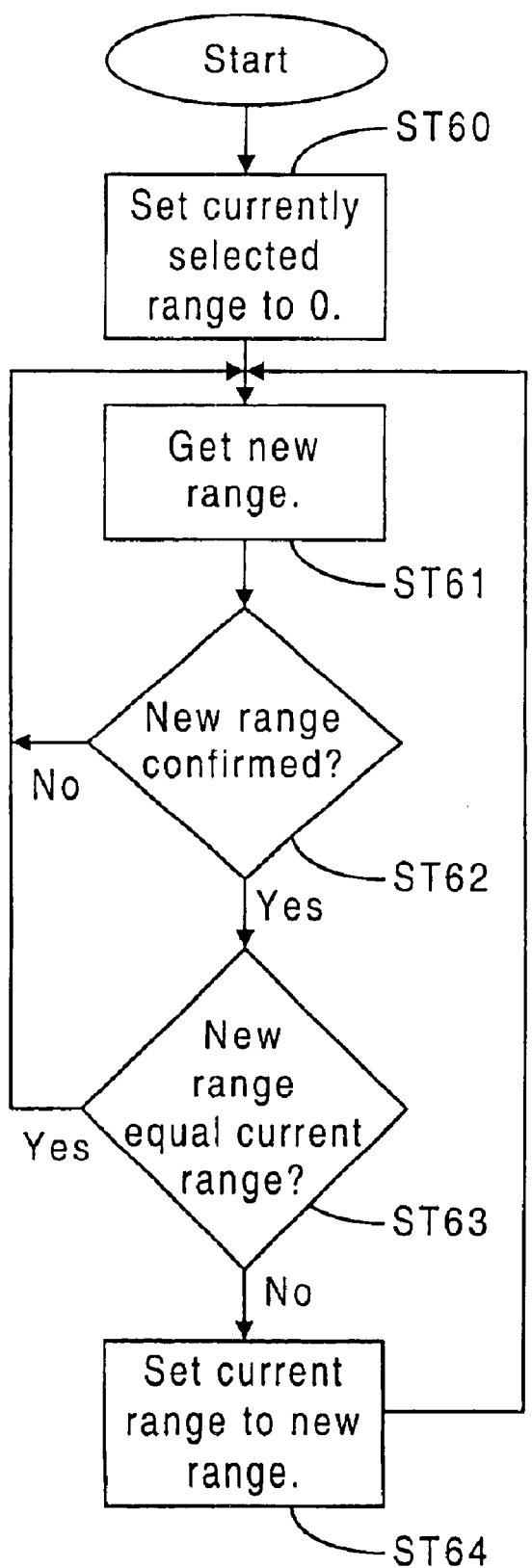
FIG. 6 is a flow diagram for a range selector.

The function of the range selector 24b as implemented by the PLD is shown in FIG. 6 (with further reference to FIG. 3). Initially, the value of the currently selected frequency range is set to zero (ST60). Next, the range selector 24b obtains a new frequency range (ST61) from the range detector 24a. The range selector 24b then confirms the new frequency range is correct (ST62) in order to prevent propagation of spurious counts that may be due to noise or spikes on the input signal. In some embodiments, confirmation may be done by obtaining and comparing two or more consecutive new frequency ranges to see if they are the same. If the second new frequency range is different from the first, the first is discarded and the range selector 24b attempts to confirm the second. Once a new frequency range is confirmed, the range selector 24b compares it to the current frequency range (ST63). If they are the same, no change takes place and the current range is maintained. If they are different, the range selector 24b configures the multiple frequency range PLL 26 to operate in the new frequency range (ST64). The range selector 24b uses combinatorial logic programmed in the PLD to assert the appropriate input pins of the PLL 26 in order to configure the PLL 26.

As previously mentioned, the range detector 24a determines an appropriate frequency range based on the count received from the frequency detector 22. In one embodiment, the count falls within one of seven possible frequency ranges, the boundaries for which are listed in TABLE 1. The count in this embodiment has been divided by a factor of two by ignoring the least significant bit from each count received from the frequency detector 22. The resulting smaller counts allow the overall amount of logic required for processing the counts to be reduced.

TABLE 1

| Range Number | Minimum Frequency (MHz) | Maximum Frequency | Minimum Count | Maximum Count |
|---|---|---|---|---|
| 0 | 2 | 3.5625 | 20 | 36 |
| 1 | 3.28125 | 5.9375 | 33 | 60 |
| 2 | 5.25 | 9.5 | 53 | 97 |
| 3 | 7.875 | 14.25 | 80 | 145 |
| 4 | 13.125 | 2.75 | 134 | 243 |
| 5 | 21 | 38 | 215 | 389 |
| 6 | 26.25 | 48 | 268 | 491 |

As a side note, the counts listed in TABLE 1 may be converted into a using the following relationship:

$$\text{Frequency} = (\text{Count} \times 50 \text{ MHz} \times \text{DF}) \div 2047 \quad \text{(Equation 1)}$$

where DF is a Division Factor, or a factor by which the input signal was divided at any point, for example, at the flip-flop 30. For the counts listed in TABLE 1, the Division Factor DF equals four to compensate for division by the flip-flop 30 and by the range detector 24a.

The boundaries of the frequency ranges in TABLE 1 have been defined to overlap so that frequency range hysteresis may be implemented. In general, the term "hysteresis" means the delaying of slowing down of an event such as the switching between the different frequency ranges. With frequency range hysteresis, a count falling within a boundary overlap will not cause a change of frequency range. Only a count falling squarely within a different frequency range outside any boundary overlaps will result in a change of frequency range. Further explanation of frequency range hysteresis is provided by the following description of the range detector 24a function.

Figure 7:
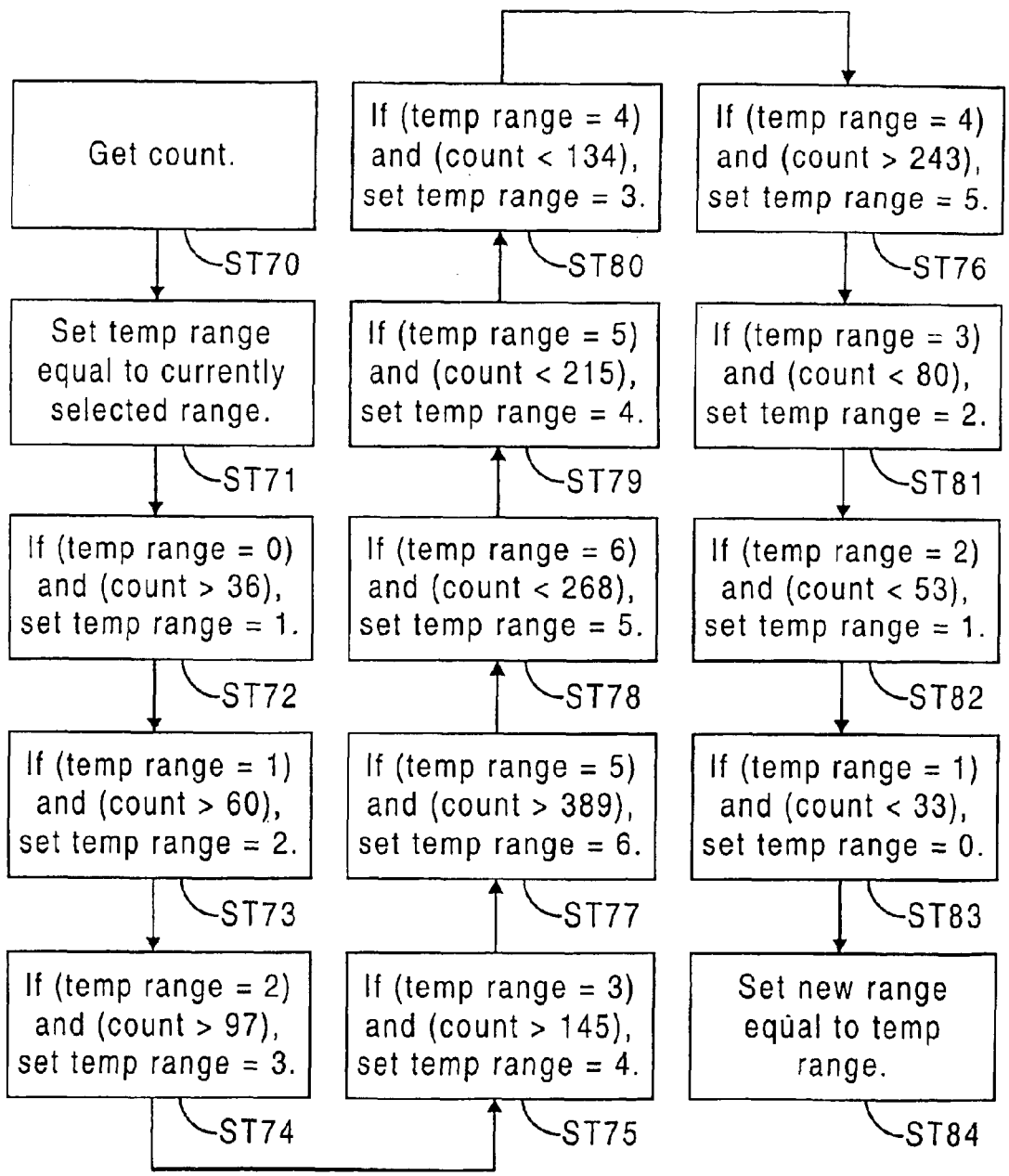
FIG. 7 is a flow diagram for a range detector.

As shown in FIG. 7 (and with reference to FIG. 3), to determine the correct frequency range for the PLL 26, the range detector 24a first obtains a count from the frequency detector 22 (ST70). The range detector 24a then assigns the value of the currently selected range number to a temporary placeholder (ST71), which will be referred to herein as "temp range" for purposes of clarity of the description. Next, if temp range equals Range 0 and the count is greater than the maximum count for Range 0, the range detector 24a assigns the value of Range 1 to temp range (ST72). If either of these conditions is not satisfied, the value of temp range remains unchanged. The range detector 24a then checks to see if temp range equals Range 1 and the count is greater than the maximum count for that range, and assigns the value of Range 2 to temp range if both conditions are met (ST73). The range detector 24a continues this manner of comparison for each range up to Range 6 (ST77), then reverses the process by comparing in descending order the minimum count for each range against the count obtained from the frequency detector 22 (ST78–ST83). After checking the count against each range in both ascending and descending order, the range detector 24a assigns the final value of temp range as the new range (ST84). This value may then be provided to the range selector 24b for configuration of the PLL 26 as needed.

The foregoing selection process uses the overlaps between the frequency range boundaries to implement frequency range hysteresis, that is, counts falling within a boundary overlap will not cause a change of frequency range. This avoids the situation where an input signal frequency falls very near the boundary between two adjacent frequency ranges and causes the PLL 26 to oscillate between the two frequency ranges. If there were no boundary overlaps, slight decreases and increases in the input signal frequency may cause the PLL 26 to cross back and forth over the boundary, resulting in continuous switching back and forth between the two adjacent frequency ranges.

Multiple Frequency Range PLL

Figure 8:
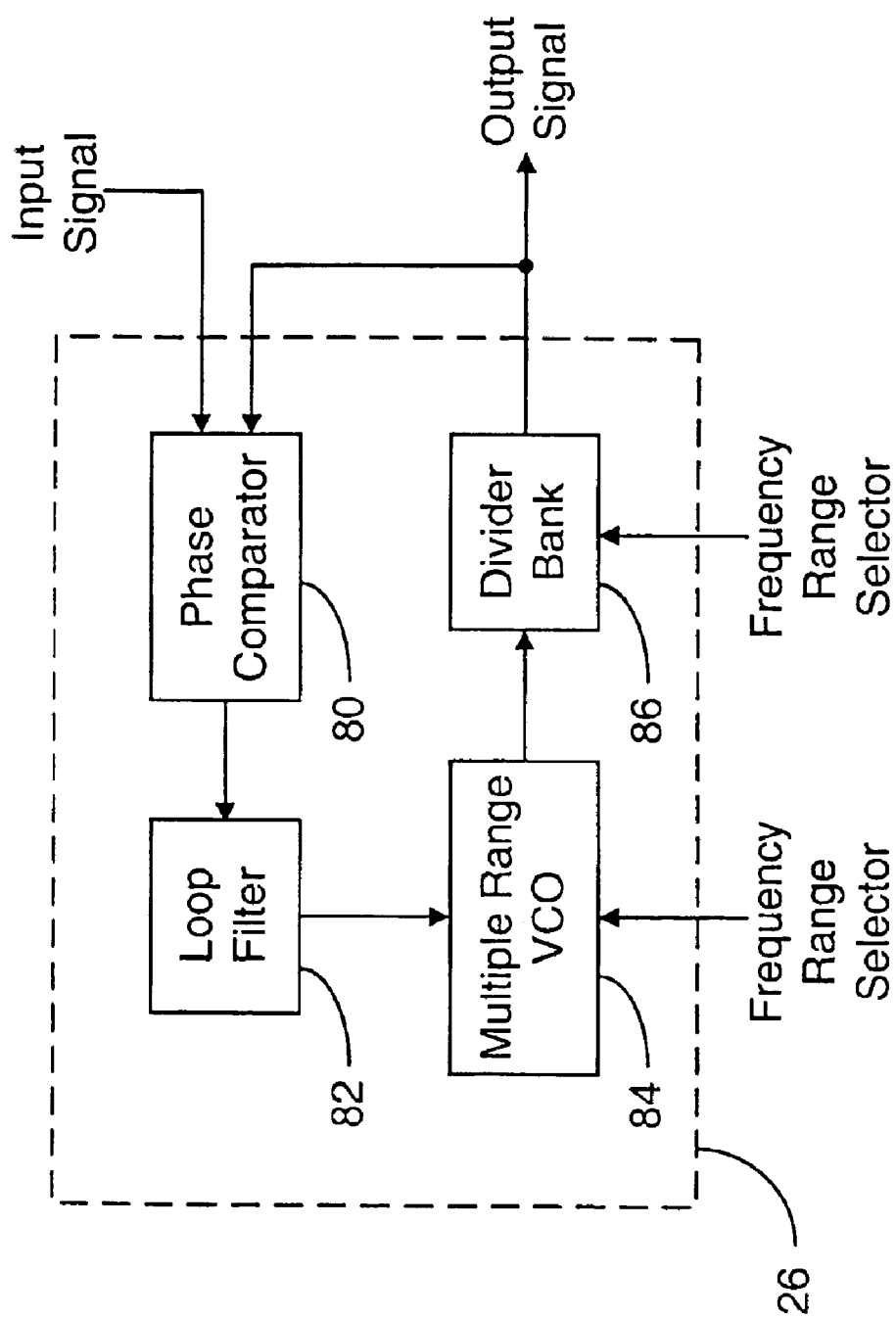
FIG. 8 is a block diagram of a multiple frequency range PLL.

Referring now to FIG. 8, the multiple frequency range PLL 26 operates essentially like the basic PLL discussed in the background section with the exception that it has a plurality of possible frequency ranges. The components of the multiple frequency range PLL 26 include a phase comparator 80, a loop filter 82, a VCO 84, and a divider bank 86, all connected as shown. The phase comparator 80 produces a DC or low frequency signal having a voltage proportional to the phase difference between the input signal and the output (or reference) signal. The loop filter 82 filters out any high frequency components that may be present in the DC or low frequency signal from the phase comparator 80 and passes the DC or low frequency signal to the VCO 84. The VCO 84 has multiple user-selectable frequency ranges and produces a signal having a frequency within one of these frequency ranges. The frequency of the signal produced by the VCO 84 is proportional to the voltage of the signal from the phase comparator 80 (via the loop filter 82). The divider bank 86 is independently configurable to divide the frequency of the signal from the VCO 84 and to output this divided signal as an output signal. In one embodiment, the VCO 84 and the divider bank 86 are controlled by the frequency range selector 24 (as shown in FIG. 3). The combination of the VCO 84 and the divider bank 86 allows the PLL 26 to operate in a plurality of frequency ranges.

In some embodiments, the multiple frequency range PLL 26 may be implemented using the PSCB from Cypress Semiconductor (described in the background section). The operating ranges of the PSCB VCO are selectable via a three-level Function Select (FS) input pin as follows: FS=LOW (15–30 MHz), FS=MID (25–50 MHz), and FS=HIGH (40–80 MHz). Two additional, three-level Function Select input pins (3F0, 3F1) may be used to configure the PSCB internal dividers to divide the output of the PSCB VCO by up to a factor of four and output this signal at the PSCB output pins (3Q0, 3Q1).

Figure 9:
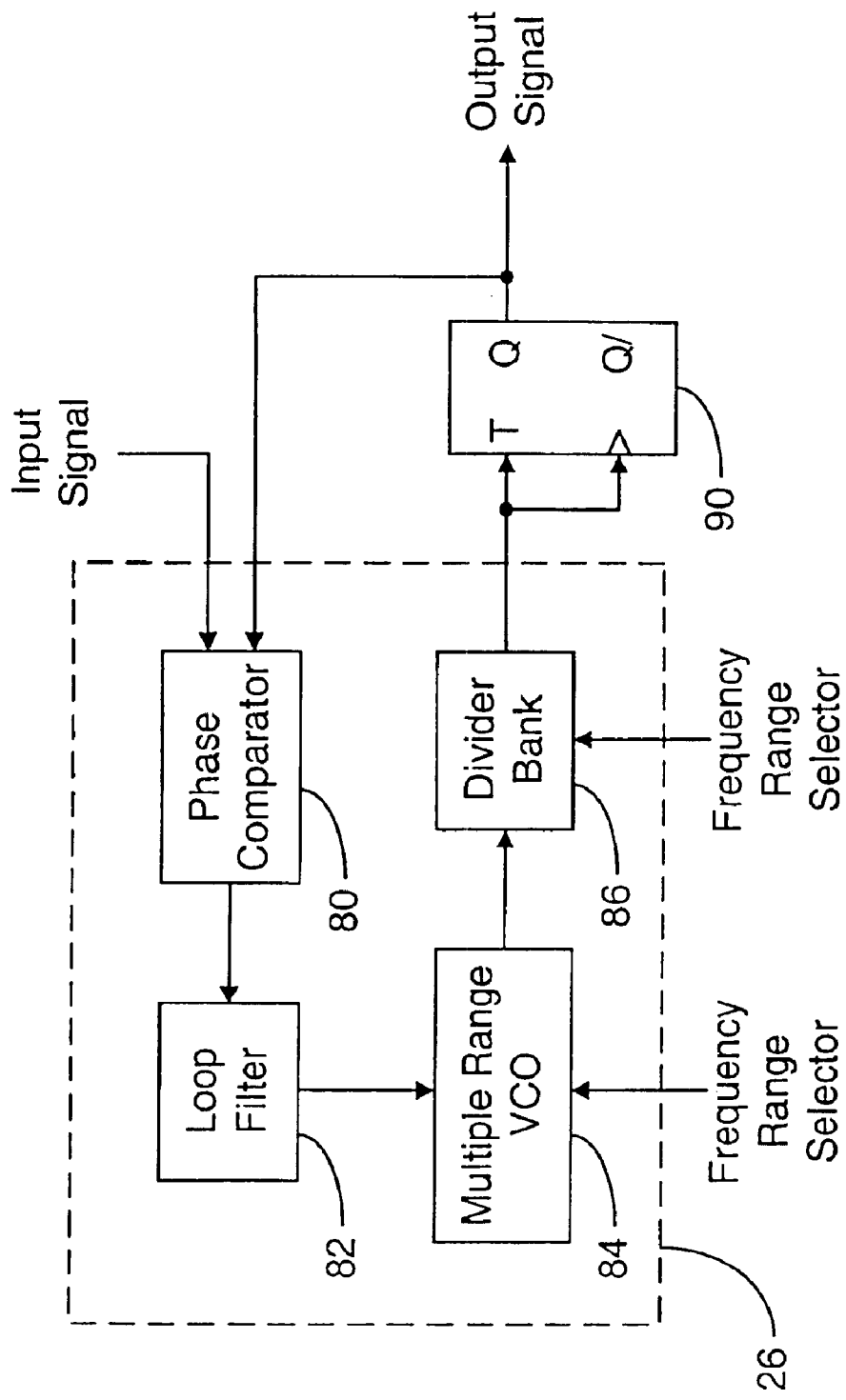
FIG. 9 is a block diagram of a multiple frequency range PLL including an external divider.

In another embodiment, referring to FIG. 9, the frequency of the output signal from the PLL 26 may be further divided by an external T-type flip-flop 90. As shown, the flip-flop 90 is configured to divide the output signal frequency by a factor of two. This is useful, for example, in an embodiment where the PLL 26 is implemented using the Cypress Semiconductor PSCB. Recall from the background section the PSCB internal dividers can be configured to divide by up to a factor of four, thus allowing the PSCB PLL to phase lock signals having frequencies as low as 3.75 MHz. Adding the external flip-flop 90 to the PSCB increases that factor to eight, thus allowing the PSCB PLL to phase lock signals having frequencies as low as 1.875 MHz. In order to phase lock an input signal having a frequency of 2 MHz, for example, the PSCB VCO would only have to generate a 16 MHz output signal (16 MHz÷8=2 MHz), which is well within the lowest frequency range of the PSCB VCO (15–30 MHz). Additional flip-flops may, of course, be added should it be necessary to phase lock signals having even lower frequencies.

TABLE 2 lists the frequency ranges and associated pin settings to configure the PSCB PLL according to one embodiment of the invention. The information contained in this table may be used by one having ordinary skill in the art to develop the combinatorial logic of the frequency range selector 24 (shown in FIG. 3) for configuring the PSCB PLL.

TABLE 2

| Range Number | Frequencies Covered (MHz) | FS | 3F1, 3F0 | 3Q0, 3Q1 | T-type Flip-Flop? |
|---|---|---|---|---|---|
| 0 | 1.875–3.75 | LOW | HIGH, HIGH | Divide by 4 | Yes |
| 1 | 3.125–6.25 | MID | HIGH, HIGH | Divide by 4 | Yes |
| 2 | 5–10 | HIGH | HIGH, HIGH | Divide by 4 | Yes |
| 3 | 7.5–15 | LOW | LOW, LOW | Divide by 2 | No |
| 4 | 12.5–25 | MID | LOW, LOW | Divide by 2 | No |
| 5 | 20–40 | HIGH | LOW, LOW | Divide by 2 | No |
| 6 | 25–50 | MID | MID, MID | Divide by 1 | No |

It is to be understood the embodiments described herein are illustrative only, and other embodiments may be derived by one having ordinary skill in the art without departing from the scope of the invention. For example, TABLE 1 lists seven frequency ranges for a 248 MHz input signal, but other bandwidths and numbers of frequency ranges may certainly be defined as required for a particular application. Also, although the frequency detector 22, frequency range selector 24, and multiple frequency range PLL 26 have been described herein as separate components, in other embodiments they may all be combined in a single semiconductor integrated circuit. In still other embodiments, they may be implemented using discrete logic components, or a combination of discrete logic components and integrated circuits. Accordingly, the scope of the invention should be limited only by the following claims.

What is claimed is:

1. A wide bandwidth phase-lock loop circuit, comprising:
   a frequency detector arranged to measure an input signal of unknown frequency to detect frequency information of the input signal, the input signal being variable in frequency over a plurality of predetermined frequency ranges;
   a frequency range selector connected to the frequency detector;
   a phase-locked loop connected to the frequency range selector and capable of phase-locking with the input signal when configured to do so for each of the plurality of predetermined frequency ranges, wherein the frequency range selector automatically determines the frequency range for the input signal and configures the phase-locked loop to generate an output signal within one of the plurality of predetermined frequency ranges based on the frequency information of the input signal, said wide bandwidth phase-lock loop circuit being operable for phase-locking to said input signal without use of a sweep generator circuit to produce a sawtooth signal for sweeping a voltage controlled oscillator through a frequency band around an estimated frequency of said input signal.

2. The circuit of claim 1, wherein the frequency range selector automatically determines the frequency range based on a comparison of the frequency information of the input signal to a plurality of predetermined and fixed values.

3. A wide bandwidth phase-lock loop circuit, comprising:
   a frequency detector arranged to measure an input signal of unknown frequency to detect frequency information of the input signal, the input signal being variable in frequency over a plurality of predetermined frequency ranges;
   a frequency range selector connected to the frequency detector;
   a phase-locked loop connected to the frequency range selector and capable of phase-locking with the input signal when configured to do so for each of the plurality of predetermined frequency ranges, wherein the frequency range selector automatically determines the frequency range for the input signal and configures the phase-locked loop to generate an output signal within one of the plurality of predetermined frequency ranges based on the frequency information of the input signal, wherein the frequency range selector employs frequency range hysteresis whereby the plurality of predetermined frequency ranges are overlapping and the frequency range selector does not reconfigure the phase-locked loop to change frequency ranges when frequencies of the input signal are in overlapping frequency ranges.

4. A wide bandwidth phase-lock loop circuit, comprising:
   a frequency detector arranged to measure an input signal of unknown frequency to detect frequency information of the input signal, the input signal being variable in frequency over a plurality of predetermined frequency ranges;

a frequency range selector connected to the frequency detector;

a phase-locked loop connected to the frequency range selector and capable of phase-locking with the input signal when configured to do so for each of the plurality of predetermined frequency ranges, wherein the frequency range selector automatically determines the frequency range for the input signal and configures the phase-locked loop to generate an output signal within one of the plurality of predetermined frequency ranges based on the frequency information of the input signal, wherein the frequency detector comprises a zero-crossing synchronizer that synchronizes the input signal to a predetermined and fixed rate clock signal to detect frequency information of the input signal.

5. A wide bandwidth phase-lock loop circuit, comprising:

a frequency detector arranged to measure an input signal of unknown frequency to detect frequency information of the input signal, the input signal being variable in frequency over a plurality of predetermined frequency ranges;

a frequency range selector connected to the frequency detector;

a phase-locked loop connected to the frequency range selector and capable of phase-locking with the input signal when configured to do so for each of the plurality of predetermined frequency ranges, wherein the frequency range selector automatically determines the frequency range for the input signal and configures the phase-locked loop to generate an output signal within one of the plurality of predetermined frequency ranges based on the frequency information of the input signal, wherein the frequency detector comprises a zero-crossing counter that counts zero-crossings of the input signal, the zero-crossing counting further comprising logic circuitry timed by a pre-determined fixed-rate clock signal with a clock frequency higher than the input signal, the logic circuitry being operable to prevent two zero-crossing counts being made during a single cycle of the input signal caused by degradation of the input signal.

6. A wide bandwidth phase-lock loop circuit, comprising:

a frequency detector arranged to measure an input signal of unknown frequency to detect frequency information of the input signal, the input signal being variable in frequency over a plurality of predetermined frequency ranges;

a frequency range selector connected to the frequency detector;

a phase-locked loop connected to the frequency range selector and capable of phase-locking with the input signal when configured to do so for each of the plurality of predetermined frequency ranges, wherein the frequency range selector automatically determines the frequency range for the input signal and configures the phase-locked loop to generate an output signal within one of the plurality of predetermined frequency ranges based on the frequency information of the input signal, wherein the frequency range selector comprises a range detector that is pre-programmed for automatically comparing the frequency information with pre-determined values and a presently set frequency range for detecting which one of the plurality of predetermined frequency ranges is an appropriate frequency range based on the frequency information of the input signal.

7. The circuit of claim 6, wherein the frequency range selector further comprises a range selector programmed for confirming that at least two consecutive detections are in the same frequency range prior to changing the frequency range.

8. The circuit of claim 1, further comprising a voltage comparator for comparison with the input signal and connected to the frequency detector and adapted to condition a wave form of the input signal.

9. A method of phase locking an input signal having a wide range of frequencies, comprising:

measuring frequency information of the input signal;

selecting one out of a plurality of frequency ranges based on the frequency information obtained by said step of measuring;

generating an output signal by phase-locking to the input signal within the selected frequency range; and confirming the selected frequency range by comparing results of at least two of said steps of measuring prior to changing the selected frequency range.

10. The method of claim 9, further comprising dividing a frequency of the output signal.

11. The method of claim 9, further comprising employing frequency range hysteresis whereby the plurality of frequency ranges are overlapping and the frequency range selector does not reconfigure the phase-locked loop to change frequency ranges when frequencies of the input signal are in overlapping frequency ranges.

12. The method of claim 9, wherein the step of measuring frequency information of the input signal further comprises timing the input signal with respect to a known clock signal having a frequency higher than the input signal to thereby prevent one cycle of the input signal being counted more than once due to degradation of the input signal.

13. The method of claim 9, further comprising synchronizing the input signal to a previously known clock signal with a frequency higher than the input signal.

14. The method of claim 9, further comprising counting zero-crossings of the input signal.

15. The method of claim 9, further comprising conditioning a wave form of the input signal.

16. A phase-lock loop circuit having a wide bandwidth, comprising:

means for measuring frequency information of an input signal;

means for selecting one out of a plurality of frequency ranges based on a comparison of the measured frequency information of the input signal with at least one of a plurality of pre-determined and fixed values; and means for phase-locking to said input signal to thereby generate an output signal in the selected frequency range.

17. The circuit of claim 16 wherein said means for phase-locking further comprises an integrated circuit operable over a plurality of frequency ranges wherein a particular frequency range is selected utilizing a plurality of frequency range pin connections on said integrated circuit.

18. The circuit of claim 16, wherein the means for selecting employs frequency range hysteresis whereby the plurality of frequency ranges are overlapping and the frequency range selector does not reconfigure the phase-locked loop to change frequency ranges when frequencies of the input signal are in overlapping frequency ranges.

19. The circuit of claim 16, wherein the means for selecting confirms the selected frequency range based on a currently selected frequency range which may or may not be the selected frequency range.

20. The circuit of claim 16, wherein the means for measuring synchronizes the input signal to a previously known clock signal with a frequency higher than the input signal.

21. The circuit of claim 16, wherein the means for measuring counts zero-crossings of the input signal.

22. The circuit of claim 16, further comprising means for conditioning a wave form of the input signal by comparing the input signal to a voltage comparator.

23. A wide bandwidth phase-lock loop circuit, comprising:

a frequency detector arranged to detect frequency information for an input signal, the frequency detector having a zero-crossing synchronizer for synchronizing the input signal to a clock signal and a zero-crossing counter for counting zero-crossings of the input signal;

a frequency range selector connected to the frequency detector and having a range detector and a range selector, wherein the range detector detects which one of a plurality of frequency ranges is an appropriate frequency range based on the frequency information of the input signal, and wherein the range selector confirms the frequency range detected by the range detector;

a phase-locked loop connected to the frequency range selector and configured by the frequency range selector to generate an output signal in the frequency range detected by the range detector, wherein the frequency range selector employs frequency range hysteresis;

a divider for dividing a frequency of the output signal; and a voltage comparator for conditioning a waveform of the input signal.

* * * * *